(12) United States Patent
Luo et al.

(10) Patent No.: US 7,365,604 B2
(45) Date of Patent: Apr. 29, 2008

(54) RF AMPLIFIER WITH A BIAS BOOSTING SCHEME

(75) Inventors: Sifen Luo, Potomac, MD (US); Yiping Fan, Fremont, CA (US); Hongyu Li, Cupertino, CA (US); Chieh-Yuan Chao, Fremont, CA (US)

(73) Assignee: Mediatek Inc., Hsin-Chu (TW)

( * ) Notice: Subject to any disclaimer, the term of this patent is extended or adjusted under 35 U.S.C. 154(b) by 159 days.

(21) Appl. No.: 11/303,358

(22) Filed: Dec. 16, 2005

(65) Prior Publication Data

US 2007/0139120 A1    Jun. 21, 2007

(51) Int. Cl.
*H03F 3/04* (2006.01)
(52) U.S. Cl. .................. 330/296; 330/285; 330/288
(58) Field of Classification Search ............ 330/296, 330/285, 288
See application file for complete search history.

(56) References Cited

U.S. PATENT DOCUMENTS

| | | | | |
|---|---|---|---|---|
| 5,548,248 A | * | 8/1996 | Wang | 330/288 |
| 5,808,511 A | * | 9/1998 | Kobayashi | 330/149 |
| 6,414,553 B1 | | 7/2002 | Luo | |
| 6,486,739 B1 | | 11/2002 | Luo | |
| 6,492,874 B1 | * | 12/2002 | Shih | 330/288 |
| 6,784,743 B2 | * | 8/2004 | Taniguchi et al. | 330/285 |
| 6,922,107 B1 | * | 7/2005 | Green | 330/296 |
| 7,224,230 B2 | * | 5/2007 | Apel et al. | 330/289 |

* cited by examiner

*Primary Examiner*—Patricia Nguyen
(74) *Attorney, Agent, or Firm*—Thomas, Kayden, Horstemeyer & Risley

(57) ABSTRACT

The present invention provides methods and apparatuses for an amplifier circuit for amplifying an input signal. An amplifier circuit for amplifying an input signal comprises an amplifying transistor circuit having a power transistor and a dc bias circuit having a plurality of current mirror circuits and a discharge transistor wherein the discharge transistor and the power transistor form a combined current mirror circuit to control quiescent current in the power transistor.

13 Claims, 2 Drawing Sheets

RF AMPLIFIER WITH A BIAS BOOSTING SCHEME

FIELD OF INVENTION

The present invention relates to RF amplifiers for communication systems and, more particularly, to methods and apparatuses for bias boosting of the RF amplifier for communication systems.

BACKGROUND

RF amplifiers play a very important role in communication systems. A linear RF amplifier is usually biased for class AB operation to achieve higher power-added efficiency (PAE). In particular, RF amplifiers biased in a class AB mode are often used in high-frequency amplification. Typically, for a conventionally biased class AB amplifier, the average bias supply current increases as the RF input power increases. The continued increase in the average current also results in an increase in the voltage drop of resistive components of the biasing circuit. The increased voltage drop across the resistive components in turn reduces the average voltage drop across the forward biased PN junction of the amplifying transistor and pushes the amplifier into class B and possibly even class C operation which causes the output power of the amplifying transistor to become saturated and the output signal to become increasingly nonlinear. The phenomenon is further accentuated as the input power to the RF amplifier is increased.

In efforts to improve linearity at the higher output power levels when the amplifier is operated in saturation or close to saturation, the bias of the amplifying transistor has to be boosted with additional current during operation near saturation. Prior-art techniques used a cascode current mirror circuit, a modified Wilson current mirror circuit, or a stacked diode circuit with a capacitor to provide bias boosting for the RF amplifying transistor. Disadvantages of the cascode current mirror circuit and the modified Wilson current mirror circuit biasing schemes include the requirement of additional resistors to achieve accurate control of the quiescent current in the amplifying transistor due to a necessary isolation resistor between RF and biasing circuits. Disadvantages of the stacked diode circuit with a capacitor include the greater difficulty of achieving sufficient control of the quiescent current since the stacked diode circuit does not form a current mirror circuit.

Accordingly, it is desirable to provide an RF amplifier that overcomes the disadvantages of current RF amplifier designs. What is needed is a method and apparatus for operating a RF amplifier that provides self-bias boosting for the amplifying transistor.

SUMMARY OF THE INVENTION

The present invention discloses methods and apparatuses for RF amplifiers with self bias boosting of the power transistor, where the RF amplifiers can be configured to be conventionally biased for class AB and used, for example, in Code-Division Multiple Access (CDMA) applications. In the preferred embodiments, the RF amplifier is based on a plurality of current mirrors to control the quiescent current in the power transistor of the RF amplifier. Accordingly, embodiments of the present invention discloses RF amplifier circuits for amplifying an input signal, comprising an amplifying transistor circuit having a power transistor and a dc bias circuit having a plurality of current mirror circuits and a discharge transistor wherein the discharge transistor and the power transistor form a combined current mirror to control quiescent current in the power transistor.

In accordance with an aspect of the present invention, the combined current mirror includes a first resistor from the amplifying transistor circuit and a second resistor from the dc bias circuit.

In accordance with another aspect of the present invention, the dc bias circuit includes a current source to provide bias current and an output terminal node coupled to a control terminal node of the power transistor via the first resistor.

In accordance to yet another aspect of the present invention, the power transistor is a common-emitter transistor and the control terminal node corresponds to a base node of the power transistor.

Other aspects and advantages of the present invention will become apparent to those skilled in the art from reading the following detailed description when taken in conjunction with the accompanying drawings.

DETAILED DESCRIPTION

As disclosed below, the present invention provides methods and apparatuses for self-bias boosting of an output amplifying transistor circuit that comprise of modified current mirror circuits. In general, the present inventive RF amplifier apparatus comprises an amplifying transistor circuit and a dc bias circuit. In accordance to an embodiment of the present invention, the dc bias circuit comprises a dual current mirror with current gain to bias the output power transistor.

Figure 1:
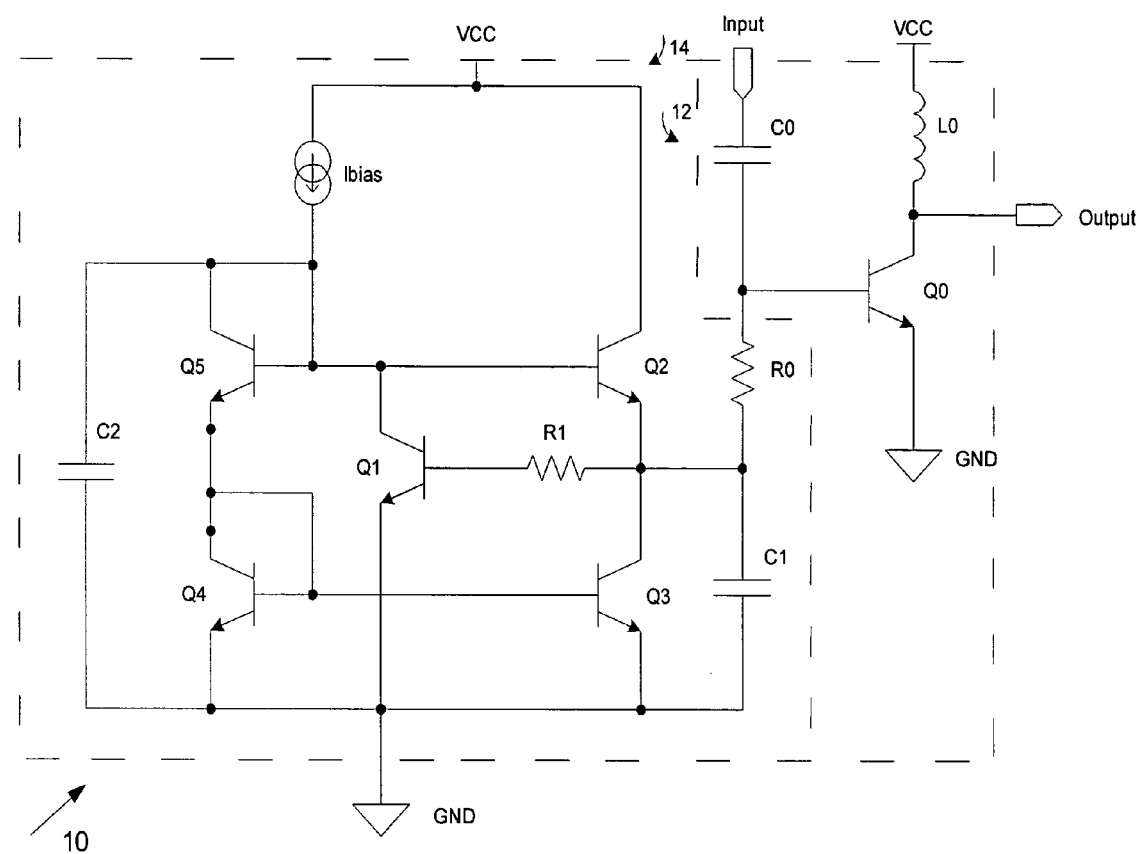
FIG. 1 illustrates a power amplifier with self-bias boosting in accordance with an embodiment of the present invention.

With reference to FIG. 1, a presently preferred embodiment of a power amplifier circuit 10 is shown. The inventive RF amplifier circuit generally comprises an amplifying transistor circuit 12 and a dc bias circuit 14. The dc bias circuit 14 comprises a modified current mirror, which acts as a self-bias boosting circuit for the amplifying transistor circuit 12. The modified current mirror provides a dual current mirror including a conventional current mirror and a cascode current mirror. Power transistor Q0 is a common-emitter transistor, in which the emitter is coupled to the ground as a common terminal (GND). The collector node of the power transistor Q0 provides an output node that is connected to a supply voltage Vcc through a pull-up inductor L0. An RF input power is applied to the base of the transistor Q0 through an AC coupling capacitor C0 and provides an input or control terminal node to the amplifying transistor circuit 12.

The dc bias circuit 14 includes bipolar transistors Q2 and Q3, coupled in series between Vcc and a common terminal (GND) and a discharge bipolar transistor Q1 coupled between a base node of transistor Q2 and the common terminal with a resistor R1 coupled between the base node of transistor Q1 and a common point of the transistors Q2 and Q3 which provides a bias circuit output terminal node for the bias circuit 14. A bias capacitor C1 is coupled to the bias circuit output node and the common terminal. The base node of the power transistor Q0 is coupled to the bias circuit output node by a resistor R0. Collector and base nodes of transistor Q5 are coupled to the collector node of the discharge transistor Q1 and are coupled to the common terminal by capacitor C2. Collector and base nodes of transistor Q4 are coupled to the base node of transistor Q3 and an emitter node of transistor Q5 with an emitter node of Q4 being coupled to the common terminal. The current source Ibias is coupled to the common point of transistors Q5, Q1, Q2 and C2 and controls both the output drive current of the bias stage and the quiescent current of the power transistor Q0.

In analyzing the dc bias circuit 14, transistors Q1 and Q2 with the power transistor Q0 and resistors R0 and R1 together form a combined current mirror circuit. Transistors Q3, Q4, and Q5 modify the current mirror circuit. In a conventional current mirror circuit, the emitter current of transistor Q2 is typically very small, which is a summation of the base currents of transistors Q0 and Q1. In the modified current mirror circuit of the present invention, the emitter current of transistor Q2 can be very high, which is a basis in providing bias boosting for the amplifying transistor Q0. Viewed alternatively, transistors Q2, Q3, Q4, and Q5 also form a cascode current mirror circuit. Discharge transistor Q1 provides a low impedance path for charges at the base-emitter junction to discharge during RF operation. Capacitors C1 and C2 are bypass capacitors. However, C1 can be used as a bias capacitor to adjust the bias boosting in the power transistor Q0. The collector node of the power transistor Q0 is the output node that is connected to the supply voltage through the pull-up inductor L0. An RF input is applied to the base of the power transistor Q0 through the coupling capacitor C0 that is part of a matching circuit to a drive stage (not shown).

As the RF input signal increases in frequency, transistor Q2 behaves as a switch and turns on and off. For example, when the RF signal at the base node of transistor Q0 is received as a positive swing, transistor Q2 will be in an off state as the positive swing of the RF signal causes the base-emitter voltage of the transistor Q2 to be less than the turn-on voltage.

Conversely, when the RF signal at the base node of transistor Q0 is received as a negative swing, transistor Q3 will be less conductive or turned-off as the negative swing of the RF signal causes the collector-emitter voltage of transistor Q3 to be much smaller for a normal operation. With transistor Q2 in the off state, transistors Q1 and Q3 will discharge the power transistor Q0 because the RF potential at the base node of transistor Q0 is higher than the RF potential at the base of transistor Q1 and the collector of transistor Q3 during the positive swing of the RF signal. In the converse, when the transistor Q2 is in the active state, transistor Q2 charges transistors Q0, Q1, and Q3. When the charging rate of power transistor Q0 is faster than the discharging rate, the average voltage across the forward-biased PN junction of transistor Q0 increases, and the self-bias boosting of the power transistor Q0 is achieved.

In accordance to an embodiment of the present invention, the current mirror circuit comprising transistors Q0, Q1, and Q2 is configured such that the current source Ibias controls the quiescent current in power transistor Q0. Accordingly, proper scaling of the transistor emitter areas and resistors influences the quiescent current in the power transistor Q0 to be directly proportional to the value of Ibias. The present embodiment provides ratios of 48 to 1 (Q0 to Q1), 6 to 1 (Q2 and Q3 to Q1) and 1 to 1 (Q4 and Q5 to Q1).

The bias circuit 14 provides a fundamental advantage that the discharge transistor Q1 discharges the power transistor Q0. The configuration of the bias circuit 14 is such that the collector node of transistor Q3 has much higher impedance than the base node of transistor Q1 and the resistor R1. The power amplifier circuit 10 in accordance to the present invention may not require bias booting adjustment from bias capacitor C1.

Often, the value of the bias capacitor C1 can be changed to adjust the charging and discharging rate to provide a desirable bias boosting for achieving optimized output power, gain, power-added efficiency (PAE), and linearity. A common technique of implementing C1 is to use an off-chip surface-mount component which provides flexibility in the changing the value of C1. However, other techniques include using an on-chip capacitor to serve the same purpose as the external surface-mount component.

To achieve higher PAE, a linear power amplifier is commonly biased in class AB operation where the power amplifier has a conduction angle greater than 180 degrees. Linearity and PAE are two contradictory requirements in the amplifier. A trade off between the linearity and PAE is used for a given set of specifications for the amplifier. Typically, the highest PAE is chosen for a particular linearity requirement such as the linearity requirement of adjacent-channel-power ratio (ACPR) in Code-Division Multiple Access (CDMA) applications that often requires control of the quiescent current in the amplifier.

Figure 2:
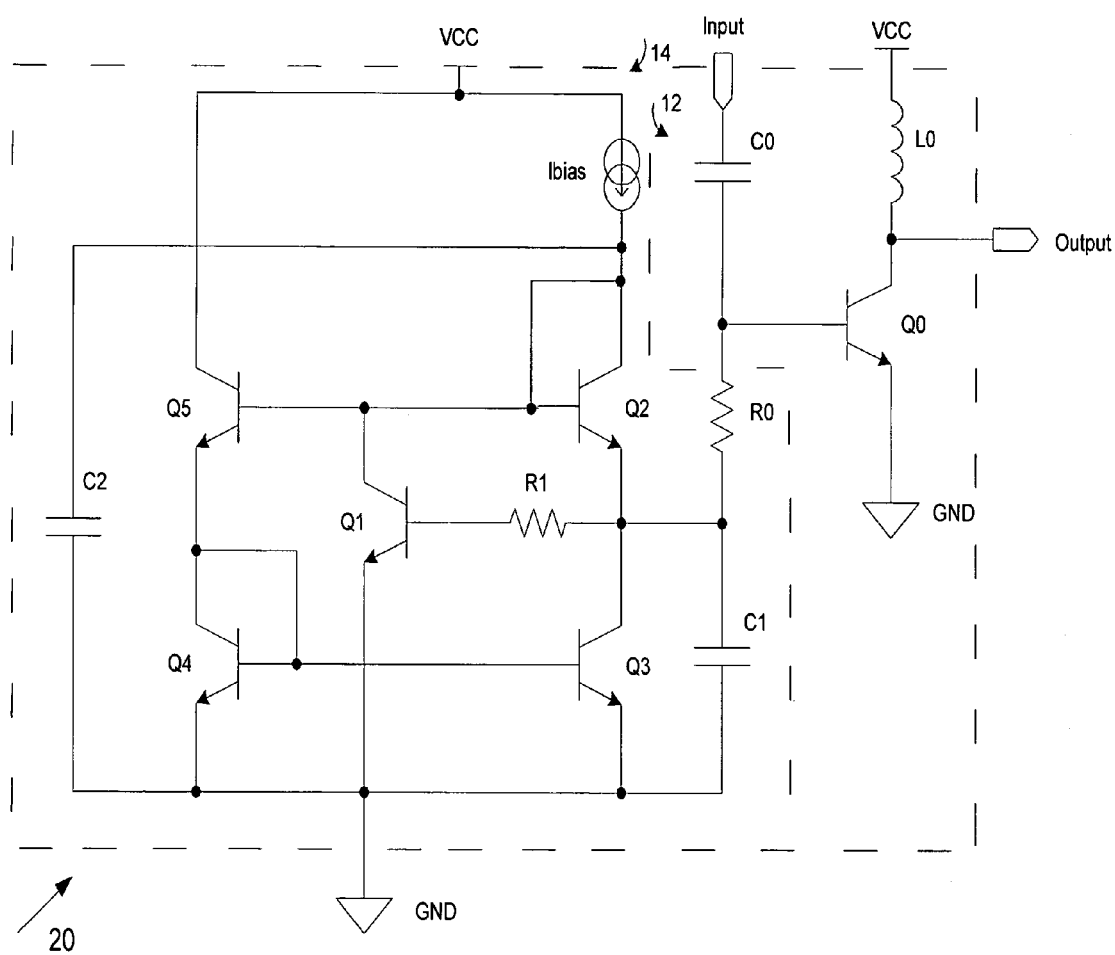
FIG. 2 illustrates a power amplifier with a modified Wilson current mirror with self-bias boosting in accordance with an embodiment of the present invention.

An alternate embodiment of the dc bias circuit 14 is shown in FIG. 2. In FIGS. 1 and 2, like reference numerals are generally used to designate like components. In FIG. 2, those portions of the circuit depicted in FIG. 2 which are identical to the like portions of the power amplifier circuit of FIG. 1 and previously described will not be described in further detail. Accordingly, FIG. 2 shows a power amplifier circuit 20.

FIG. 2 differs from FIG. 1 in that the cascode current mirror circuit of transistors Q2 and Q5 is replaced with a modified Wilson current mirror circuit. Specifically, Ibias is connected to the collector and base nodes of transistor Q2 and the base node of transistor Q5. The collector node of transistor Q5 is coupled to Vcc. The embodiment of FIG. 2 operates similarly as the embodiment of FIG. 1 and shows the symmetry of the current mirror circuit. Another advantage of the bias circuits shown in FIGS. 1 and 2 is that the circuits work as a cascode current mirror, a conventional current mirror, or a combination of both if two switches are placed between the current source Ibias and the collectors of Q1 and Q5 (FIG. 1) or Q1 and Q2 (FIG. 2) in accordance to a further embodiment of the present invention. Therefore, the present invention has advantages of flexibility to suit specific design needs. Switches are readily available in an IC process.

In connection with the circuits shown, it should be understood that although the active components are shown as bipolar transistors for illustrative purposes, field effect transistors or a combination of bipolar and field effect transistors may alternatively be used within the scope of the invention. Additionally, it is to be understood that the power amplifier circuit 12 and the bias circuit 14 may differ in form and detail from the simplified, illustrative depictions shown in FIGS. 1 and 2. Furthermore, it is to be understood that the bias boost circuit may be configured and adjusted to permit the power amplifier circuit to operate in either Class B or Class AB mode.

While the invention has been described in details with reference to the present embodiment, it shall be appreciated that various changes and modifications are possible to those skilled in the art without departing the spirit of the invention.

For example, the capacitor C1 may be omitted and the alternate placement of the Ibias current source as described. Thus, the scope of the invention is intent to be solely defined in the accompanying claims.

We claim:

1. An amplifier circuit for amplifying an input signal, comprising:
    an amplifying transistor circuit having a power transistor; and
    a dc bias circuit having a plurality of current mirror circuits, comprising:
    a current source configured to provide bias current;
    an output terminal node coupled to a control terminal node of the power transistor via the first resistor;
    a first pair of mirror transistors having a first transistor and a second transistor, wherein an emitter node of the first transistor is coupled to a collector node and a base node of the third transistor and an emitter node of the second transistor is coupled to a collector node of the fourth transistor to provide the output terminal node;
    a second pair of mirror transistors having a third transistor and a fourth transistor wherein the current source is coupled to a collector node and a base node of the first transistor; and
    a discharge transistor wherein the discharge transistor and the power transistor form a combined current mirror.

2. The amplifier circuit of claim 1, wherein the combined current mirror includes a first resistor from the amplifying transistor circuit and a second resistor from the dc bias circuit.

3. The amplifier circuit of claim 1, wherein the power transistor is a common-emitter transistor and the control terminal node corresponds to a base node of the power transistor.

4. The amplifier circuit of claim 1 further comprising a bias capacitor coupled between the output terminal node and a common ground configured to adjust bias boosting of the power transistor.

5. The amplifier circuit of claim 1, wherein:
    a collector node of the discharge transistor is coupled to base nodes of the first pair mirror of transistors;
    and an emitter node of the discharge capacitor is coupled to a common ground.

6. The amplifier circuit of claim 5, wherein the output terminal is a common junction of the second transistor and the fourth transistor, the second transistor is configured to charge the power transistor through the first resistor at a charge rate and the fourth transistor and the discharge transistor are configured to discharge the power transistor via the first resistor at a discharge rate that is slower than the charge rate.

7. The amplifier circuit of claim 1, wherein the plurality of current mirror circuits includes a modified Wilson current mirror.

8. An amplifier circuit for amplifying an input signal, comprising:
    an amplifying transistor circuit having a power transistor; and
    a dc bias circuit having at least one current mirror circuit, comprising:
    a first pair of mirror transistors having a first transistor and a second transistor, wherein an emitter node of the first transistor is coupled to a collector node and a base node of the third transistor, an emitter node of the second transistor is coupled to a collector node of the fourth transistor, a collector node of the discharge transistor is coupled to base nodes of the first pair of mirror transistors, and an emitter node of the discharge capacitor is coupled to a common ground;
    a second pair of mirror transistors having a third transistor and a fourth transistor;
    a current source coupled to a collector node and a base node of the second transistor; and
    a discharge transistor configured to self bias the amplifying transistor circuit wherein the discharge transistor and the power transistor form a combined current mirror circuit.

9. The amplifier circuit of claim 8, wherein the plurality of current mirror circuits includes a modified Wilson current mirror.

10. The amplifier circuit of claim 8, wherein a common junction of the second transistor and the fourth transistor comprise an output terminal and the second transistor is configured to charge the power transistor at a charge rate and the fourth transistor and the discharge transistor are configured to discharge the power transistor at a discharge rate that is slower than the charge rate.

11. A method of operating an amplifier for amplifying an input power having an amplifying transistor circuit including a power transistor and a self boosting bias circuit having a plurality of transistors, the power transistor of the amplifying transistor circuit and a transistor of the self boosting bias circuit forms a combined current mirror circuit, comprising the steps:
    charging the power transistor at a charge rate with the combined current mirror circuit when the input power is at a first level; and
    discharging the power transistor at a discharge rate with the combined current mirror circuit when the input power is at a second level wherein the charge rate is faster than the discharge rate as the input power is increased.

12. The method of operating an amplifier according to claim 11 further comprising a step of forming a modified Wilson current mirror circuit within the self boosting bias circuit.

13. The method of operating an amplifier according to claim 11 further comprising the step of discharging the power transistor with a discharge transistor within the self boosting bias circuit.

* * * * *